United States Patent
Pellegrin

(10) Patent No.: US 8,691,677 B2
(45) Date of Patent: Apr. 8, 2014

(54) METHOD FOR BORON DOPING SILICON WAFERS

(75) Inventor: Yvon Pellegrin, Frontignan (FR)

(73) Assignee: SEMCO Engineering SA, Montpellier (FR)

( * ) Notice: Subject to any disclaimer, the term of this patent is extended or adjusted under 35 U.S.C. 154(b) by 39 days.

(21) Appl. No.: 13/262,993

(22) PCT Filed: Apr. 6, 2010

(86) PCT No.: PCT/EP2010/054487
§ 371 (c)(1),
(2), (4) Date: Nov. 23, 2011

(87) PCT Pub. No.: WO2010/115862
PCT Pub. Date: Oct. 14, 2010

(65) Prior Publication Data
US 2012/0083105 A1    Apr. 5, 2012

(30) Foreign Application Priority Data
Apr. 6, 2009  (FR) ...................................... 09 01708

(51) Int. Cl.
*H01L 21/22* (2006.01)
(52) U.S. Cl.
USPC ........................................................ 438/565
(58) Field of Classification Search
USPC ............................ 438/181, 542, 565; 118/900
See application file for complete search history.

(56) References Cited

U.S. PATENT DOCUMENTS

| 3,574,009 A | 4/1971 | Chizinsky et al. |
| 4,381,213 A | 4/1983 | Flowers et al. |
| 4,791,005 A * | 12/1988 | Becker et al. ............ 427/255.29 |
| 5,208,185 A * | 5/1993 | Mori et al. .................... 438/566 |
| 5,256,595 A | 10/1993 | Flemish et al. |
| 5,268,062 A * | 12/1993 | Darling, Jr. .................. 427/122 |

FOREIGN PATENT DOCUMENTS

JP    60 005511 A    1/1985

OTHER PUBLICATIONS

Geiss V. et al.: "Mass Spectrometric investigation of the reaction velocities of BC13 and BBr3 with oxygen and water vapor in a diffusion furnace [dopant source for Si]", Journal of the Electrochemical Society USA, vol. 123, No. 1, Jan. 1976, pp. 133-136, XP002560936, ISSN: 0013-4651.
International Search Report, dated Jun. 2, 2010, from corresponding PCT application.
Singapore Written Opinion, dated Aug. 13, 2013, from corresponding SG application.

* cited by examiner

*Primary Examiner* — Brook Kebede
(74) *Attorney, Agent, or Firm* — Young & Thompson

(57) ABSTRACT

The object of the invention is a process for P-type boron doping of silicon wafers placed on a support in the chamber of a furnace of which one end comprises a wall in which means for introducing reactive gases and a gas carrying a boron precursor in gaseous form are located, whereby said process comprises the stages that consist in: a) In the chamber, reacting the reactive gases with boron trichloride $BCl_3$ that is diluted in the carrier gas at a pressure of between 1 kPa and 30 kPa, and a temperature of between 800° C. and 1100° C., for forming a boron oxide $B_2O_3$ glass layer, b) Carrying out the diffusion of atomic boron in silicon under an $N_2+O_2$ atmosphere at a pressure of between 1 kPa and 30 kPa. A furnace designed for the implementation of said doping process as well as its applications—the manufacturing of large boron-doped silicon slices, in particular for photovoltaic applications—is also claimed.

16 Claims, 1 Drawing Sheet

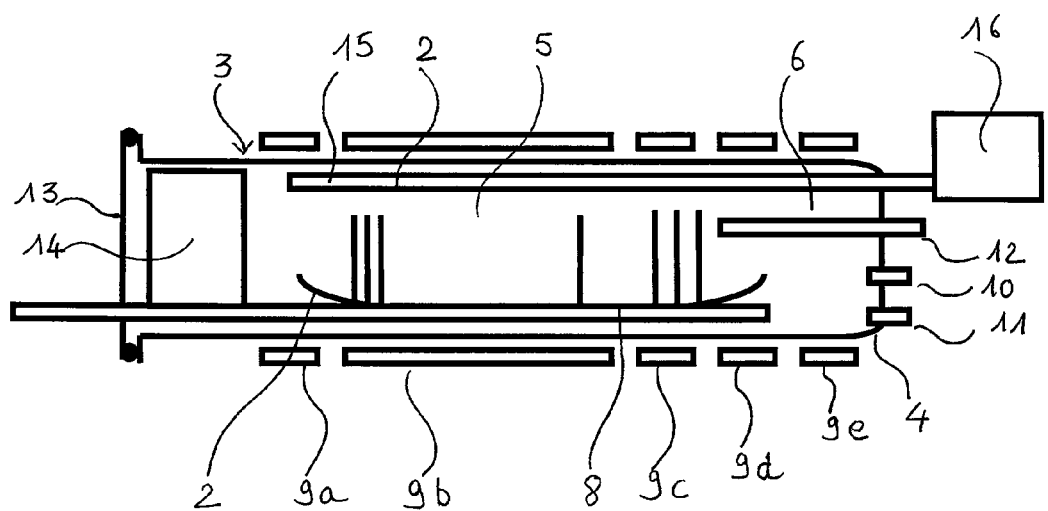

METHOD FOR BORON DOPING SILICON WAFERS

This invention pertains to the field of the manufacturing of silicon wafers that go into the process of producing semiconductors and photovoltaic cells, and in particular to operations for doping silicon wafers.

The object of the invention is a process for P-type boron doping of silicon using boron trichloride as a precursor, which process is carried out at reduced pressure. It also has as its object a furnace that is designed to implement said doping process as well as its application to the manufacturing of large boron-doped silicon slices.

In the process of developing integrated circuits for electronics as well as solar cells, the production of semi-conductors rests on technologies based primarily on the inherent modification of the silicon material by doping. The doping of a material consists in introducing into its matrix atoms of another material. These atoms will be substituted with certain initial atoms and thus will introduce more electrons or create holes. The insertion of electron-deficit elements into the silicon mesh results in a material that is considered to be positively charged, hence the P-type doping term. The boron element produces such a doping type.

Doping is commonly carried out in a reactor or furnace, subjected to specified pressure and temperature. The doping element is introduced into the furnace in the form of a precursor compound in the vapor state, where it reacts with one or more reactive gases for producing the doping compound per se that is deposited and diffuses the doping agent in the atomic network of the silicon. It is introduced into the chamber of the furnace using a carrier gas that has the role of driving it to the surface of the silicon wafers. To do this, it is diluted in the carrier gas by contact with the source of said precursor, the latter being able to be a solid, liquid or gaseous source.

For the industrial production, horizontal or vertical furnaces are used, whose chamber generally assumes the shape of a cylindrical tube and in which the silicon wafers are arranged on a support made of quartz or silicon carbide. One of the ends of the chamber is equipped with a door for allowing the introduction of the wafers. The other end is blocked by a stationary terminal wall. The doping gas, the carrier gas, and the reactive gases can be introduced through one of the walls of the chamber, conveniently through the terminal wall.

It is known that the operating conditions, in particular the temperature and the pressure, are critical parameters of the dynamics of the fluids in a reactor, but also that they have a decisive influence on the reaction kinetics, with the formed compounds being able to be greatly different according to the choices made. In particular, it is necessary to prevent the formation of compounds that are aggressive toward the reactor or harmful for the operators, and also to limit the production of secondary reaction products that come to disturb the doping quality, fouling the chamber and polluting the gaseous effluents.

It is imperative that the gaseous circulation be optimum for obtaining a homogeneous wetting of the wafers that are arranged over the entire length of the reactor (i.e., a contact of the gaseous mixture with all of the surfaces to be treated) and a uniform deposit over the entire surface of the wafers. Furthermore, it is essential that the oxidation of the precursor be controlled so that the desired compound forms and is deposited correctly, without causing the formation of undesirable reaction products.

According to one of the most used doping processes, called "open tube" because it is carried out in a furnace at atmospheric pressure, the silicon wafers are introduced into the furnace and brought to a temperature that is generally between 800° C. and 1200° C. This temperature is necessary for ensuring the penetration by diffusion of the doping agent in a superficial layer of the silicon wafer.

However, these processes generate significant risks for dissemination of acid in the furnace and the environment. In the reactive chamber, this presence of acid obtained from the doping agent has repercussions on the repetitiveness of the treatment of wafers and often creates problems of pitting of the silicon surface by HCl. The possible release of acid vapors into the environment of the furnace leads to extended maintenance shutdowns and a loss of productivity.

Because of a great depletion from one point to the next of the chamber, the gases are to be sent with a high flow rate to obtain a homogeneous distribution over all of the wafers, which generates a significant consumption of gas and consequently of effluents to be treated. Because of this depletion, for obtaining a good uniformity of doping without excessively increasing costs, the furnaces have to remain moderate in size, making it necessary to treat wafers of modest dimensions (less than 10 cm$^2$), and a relatively large space (greater than 5 mm) is to be provided between each wafer. The number of wafers that can be loaded into the furnace is thus limited to about 50 units. This constraint is particularly disadvantageous for the manufacturing of wafers for solar cells.

More specifically regarding boron doping, attempts have been made to develop doping methods whose purpose is to remedy these problems. Tests for using different boron sources have been carried out. However, there are numerous obstacles to overcome. Boric acid mixed with tetra-ethyl-ortho-silicate (TEOS) is to be eliminated because, even with the maximum degree of purity, it still contains iron, which cuts the yields. The conventional BBr$_3$ is a toxic and harmful liquid for the operators as well as for the equipment. Diborane, which is a poisonous gas, should be discharged for obvious safety reasons. Because of these drawbacks, the producers are seeking a technology that uses a gaseous precursor of low toxicity.

Bromine trichloride is a gaseous compound that meets this requirement. It has been abandoned, however, because of the difficulty in controlling its reactivity. On this subject, it is possible to mention the patent U.S. Pat. No. 4,381,213 that describes a method for boron doping of silicon wafers by BCl$_3$, the latter requiring numerous stages. An oxide layer of 50 Angstroms is first formed for protecting the surface of the wafers from aggressive products formed by reaction of the boric compound in the following stages. Then, a gaseous composition that contains the boric precursor is introduced into the reactor at the same time as an oxidizing gas, the whole mixture reacting under a controlled vacuum of between 6.7 Pa and 66.5 Pa for forming a layer of a boron-containing compound on the wafers. Finally, a heating stage causes a redistribution of boron and its incorporation in the wafers at the desired depth. However, it still remains to achieve the re-oxidation of the boron-containing layer so that it can be eliminated without damaging the surface of the wafers.

Certain approaches have attempted to increase the spacing between the wafers or to increase the gaseous flow rate, which is not satisfactory as it was explained above. Other approaches have resorted to treatment under low pressure, but these technologies are very restrictive in their use. Still others have been turned toward the use of very different technologies, such as ion implantation, with very cumbersome economical and industrial characteristics that are unsuitable for the applications targeted here.

Thus, there is a need that has been expressed for numerous years and not met until today of using a technology that makes it possible to implement a doping of silicon by boron that is homogeneous, reproducible and reliable, and which makes it possible to treat in one cycle more than 100 wafers of large size, with a moderate consumption of gas.

This invention has as its objective to solve the problems mentioned above for meeting this need by proposing a new process for doping silicon by boron.

The proposed process offers the advantage of operating at reduced pressure, i.e., at a pressure that is sub-atmospheric, but, however, very superior to pressures of processes that arise from the technologies of LPCVD (for Low Pressure Chemical Vapor Deposition) that are on the order of several pascals. The operating conditions that are defined make it possible to use boron trichloride $BCl_3$ (also called trichloroborane), a gas that is considered as having a reactivity that is difficult to control as a precursor compound of the doping element. Owing to the development of these particular operating conditions, it is possible from now on to carry out boron doping using a precursor gas that offers the advantage of being relatively easy to manipulate for the users. Another advantage of the proposed process rests on a tight mixture of gases in a certain order, which promotes a uniform deposition over all of the wafers. The performance levels thus achieved open up the possibility of carrying out the doping of wafers of large size and in large quantities, which are usable in particular for the manufacturing of photovoltaic cells, with an excellent yield and under unequaled safety conditions.

The other industrial constraints for carrying out the oxidation of the precursor and the deposition and then the diffusion of boron in the silicon layer are observed and culminate in a high-quality doping of the treated wafers.

Thus, this invention has as its object a process for boron doping of silicon wafers that are placed on a support in the chamber of a furnace of which one end comprises a wall in which means for introducing reactive gases and a gas carrying a boron precursor in gaseous form are located, whereby said process comprises the stages that consist in:

a)—In the chamber, reacting the reactive gases with boron trichloride $BCl_3$ that is diluted in the carrier gas at a pressure of between 1 kPa and 30 kPa, and a temperature of between 800° C. and 1100° C., for forming a boron oxide $B_2O_3$ glass layer, b)—Carrying out the diffusion of atomic boron in silicon under an $N_2+O_2$ atmosphere at a pressure of between 1 kPa and 30 kPa.

The process is carried out in a furnace, assuming, for example, the shape of a commonly horizontal cylindrical tube, provided with a chamber that is hermetically sealed by a door and into which wafers are introduced. The furnace comprises pipes for injecting gases into the chamber under perfectly controlled flow and pressure conditions for accomplishing the stages referred to above. The extraction of gases is ensured by an additional pipe located in the wall of the reactor. The opening of this pipe is located at the end that is opposite to the gas injection pipes, preferably on the left side. Heating means that consist of, for example, electrical resistors are distributed around the chamber, separated from the latter or else touching it.

The furnace is provided with gas extraction means, comprising suction means that are connected to the above-mentioned evacuation pipe, contributing to creating a constant and controlled partial vacuum in the chamber. This suction makes it possible to direct and to maintain the speed of the gases in the chamber while constantly evacuating the effluents therefrom so as to favorably shift any chemical balances during reactions. These gas extraction means have as an essential component a membrane pump whose elements in contact with the gases consist of a perfluorinated polymer compound. In the same way, all of the elements in contact with the reactive gases are made of perfluorinated polymer, quartz or silicon carbide.

According to the process, in a first step, the decomposition of the boron precursor produces an oxide compound $B_2O_3$ that is deposited in the form of glass on the silicon of the wafers, and, in a second step, there is diffusion of boron atoms in the silicon and local modification of its semi-conductive properties, whereby this stage carries out the doping of silicon per se.

These two stages are conducted at so-called sub-atmospheric pressure levels and are compatible with relatively simple means for the creation of the partial vacuum, unlike tools and processes used in low-pressure technologies such as LPCVD and in atmospheric technologies.

For the purposes of this description, the reactive gases refer to the gases that react with the precursor gas (excluding the precursor gas itself). Typically, for the sake of clarity and although other gases can be used, the reactive gases mentioned here will be oxygen and hydrogen, with the carrier gas being nitrogen. The carrier gas can be introduced into the chamber whether or not it contains the precursor gas, according to the stage of the process in question, which will be specified if the context does not make it obvious. The primary characteristics of the chemical reactions in question and in particular their kinetics have been published by V. Geiss and E. Fröschle in J. Electrochem. Soc.: Solid State Science and Technology, January 1976, pp. 133 to 136.

It is also emphasized that the physical values (temperature, pressure, flow rates, etc.) are provided by reference to normal temperature and pressure conditions.

According to one particular embodiment of the invention, in stage b), the pressure in the chamber is between 15 kPa and 30 kPa (or between 150 mbar and 300 mbar). Thus, during this second phase of the process, it is possible either to maintain a pressure that is identical to the one of the first phase or to increase it if it is desired to accelerate the diffusion of the doping agent in the silicon network, without hampering the desired quality of the final product.

According to one preferred characteristic of the process that is the object of the invention, during stages a) and b), the temperature in the zone of the chamber in the vicinity of the wafers is between 900° C. and 1000° C. The object of interest here is specifically the treatment zone, i.e., the zone of the furnace where the wafers are placed during the cycle and where the deposition of the precursor occurs, with the other segments of the furnace being able to be regulated in temperature in a different manner, as will be seen later.

In one advantageous embodiment of this invention in stage a), the boron trichloride is provided in the chamber at a rate of 20 cm$^3$/minute to 100 cm$^3$/minute. It is preferably introduced into the chamber with a flow rate that represents approximately one quarter of the flow rate of the injected oxygen.

As already indicated, boron trichloride is distributed using a carrier gas, the one being a neutral gas, for example nitrogen or argon. In an unexpected way, it appeared that the dilution factor could be very large. Thus, according to the invention, the boron trichloride is diluted in the carrier gas at a concentration of between 3% and 95% by volume.

According to another advantageous characteristic of the process that is the object of the invention, the total gaseous flow rate in the chamber is less than 5 liters per minute.

According to an advantageous characteristic of the process that is the object of the invention, the reactive gases and the gas carrying boron dichloride are introduced into a free zone that is located in the section of the chamber between the end wall and the treatment zone that accommodates the wafers, where the gases are mixed before flushing and wetting said wafers, with the free zone advantageously occupying 10% to 20% of the total volume of the chamber.

Actually, if the mixing of gases is done ex situ, i.e., before their injection into the chamber, the reactions are difficult to control because of the high reactivity of the compounds involved. In contrast, when the mixing of gases is done at the level of the wafers, the homogeneity of the doping is very poor, and reproducibility is uncertain. The deposition of oxide is satisfactory when the mixing of reactive gases with the precursor is done in situ, i.e., in the very chamber, at the level of the free space that is lacking wafers, provided for this purpose. This free volume thus appeared necessary and adequate for carrying out in an optimal manner the mixing of different gases that have to react together so as to carry out the deposition of boron oxide. Preferably, for reasons of implementation, this free zone is located on the side that is opposite to the end of the furnace that is provided with the door.

According to another advantageous characteristic of the process according to the invention, during stage a), the temperature in the free zone of the chamber is 5% to 15% less, preferably approximately 10% less, than the temperature of the treatment zone. The heating means of the chamber that are used here consist of, in a known manner, several independent elements that make possible the embodiment of an adaptable and controllable longitudinal thermal profile. One of these elements is placed at the free zone and is controlled in a separate manner in such a way as to obtain a lower temperature in this free zone than in the treatment zone of the chamber.

In an advantageous manner, in the process according to this invention, the gases that react with the precursor are oxygen and hydrogen, the carrier gas is nitrogen, and each of said gases is introduced into the chamber by a separate pipe. It goes without saying that the carrier gas is loaded with precursor during the treatment, but it can be introduced by itself during operations related to the treatment itself.

Thus, contrary to other techniques, the reactive gases and the precursor of the doping agent ($H_2$, $O_2$ and $BCl_3$) are injected separately and interact only starting from the time when they enter the chamber at a given temperature. The mixing is all the more effective as it can be done before reaching the wafers, in a zone that is free and less hot. This offers the advantage of homogenizing the $N_2$—$BCl_3$ and $H_2$ mixture before initiating the chemical reactions that lead to the oxidation and the deposition of the precursor. It is thus possible to obtain a better control of the reaction kinetics that take place only in the chamber.

According to a preferred characteristic of the process that is the object of the invention, the hydrogen and the carrier gas that may or may not be charged with the boric precursor are introduced into the free zone of the chamber in the vicinity of the end wall, and the oxygen is introduced in the vicinity of the treatment zone. Thus, the precursor gas that is diluted in the carrier gas and hydrogen are mixed before reacting with oxygen, in the vicinity of the hottest zone, as close as possible to the location occupied by the wafers. Furthermore, the gases are evacuated by an extraction pipe whose opening opens opposite the end wall, with said pipe being connected to a suction unit that is equipped with a system for regulating and controlling the pressure that prevails in the chamber. The reaction kinetics appeared improved by this device.

According to a particular embodiment of this invention, in stage a), the gases are introduced into the chamber in the following volumetric proportions:

Carrier gas+precursor of boron: 55% to 80%,
Hydrogen: 0.5% to 15%,
Oxygen: 15% to 30%.

These particular proportions illustrate a combination of possible values from among others for producing a boron-doped silicon layer, meeting the requirements of homogeneity and uniformity. For example, it is possible to use ¼ oxygen, ⅛ hydrogen and ⅝ carrier gas+precursor. It also appeared, in an unexpected manner, that a small quantity of hydrogen was sufficient for an entirely satisfactory implementation of the process.

In addition, in an advantageous manner, the process according to the invention comprises a stage preceding stage a), during which the operating parameters of the reactive gases and the carrier gas—namely flow rates, pressure, fluxes, and temperatures—are stabilized. During this stage, which is short (it lasts several tens of seconds), a superficial moist oxidation of silicon occurs, which prevents the undesirable formation of compounds such as $Si_yB_x$ during the contact of the precursor and silicon. The water vapor is formed by reaction of oxygen with hydrogen.

For the production of the process according to the invention, one skilled in the art will set the deposition time of the precursor and diffusion of boron based on results sought in terms of concentration of the doping element and the depth of penetration in the silicon. For example, stage a) for deposition of a boron oxide $B_2O_3$ glass layer can be conducted during approximately 5 to 30 minutes, and the stage b) for diffusion of atomic boron can last from approximately 10 to 30 minutes.

At the level of the industrial operation, the process as it was just described is particularly effective because it offers high reproducibility, including following restarts after shutdowns. No excess (overdose) of doping agents nor any memory effects have been observed. In comparison with the atmospheric technologies or LPCVD, the peripheral property is satisfactory; the frequency of cleaning is greatly reduced. As a result, maintenance times are significantly shortened, and more generally, the operating costs are proportionately reduced.

The process claimed here can advantageously be implemented in a furnace whose general model is that of the furnaces used in related technologies for doping under reduced pressure, in particular relative to the means for producing partial vacuum by a membrane pump and the monitoring and regulation of this partial vacuum, such as the one described in the patent application FR 2 824 663 but comprising suitable characteristics able to satisfy the particular features of boron doping under the conditions specified above.

This is why a furnace for boron doping of silicon wafers placed on a support, comprising a chamber of which one end comprises a wall in which means are provided for introducing reactive gases and a gas carrying a boron precursor in gaseous form, is also an object of this invention, with said furnace being characterized in that the chamber comprises a zone for receiving the support of wafers, said treatment zone, and a free zone located between said end wall and said zone for receiving the support of the wafers, whereby said free zone occupies from 10% to 20% of the total volume of the chamber.

The furnace that is the object of the invention is advantageously equipped with means for heating the chamber that consist of several independent elements that make possible the embodiment of an adaptable and controllable longitudinal thermal profile, at least one of these elements being dedicated to specific heating of the free zone. In an optimal manner, five elements are placed along the wall of the chamber, each one being equipped with sensors and means for regulating the temperature in the corresponding segment of the furnace. This arrangement prevents the appearance of thermal differences along the treatment zone of the furnace, in particular at the level of the door, while making it possible, as is desired here, to reduce the temperature at the end of the chamber.

According to a preferred characteristic of the invention, said furnace comprises two separate pipes: one for introducing a first reactive gas, for example hydrogen, and the other for introducing the carrier gas (and boron precursor), the latter emptying into the free zone in the vicinity of the end wall, and a pipe for introducing a second reactive gas, for example, oxygen, emptying in the vicinity of the treatment zone. It also comprises a gas extraction pipe of which the opening opens opposite the end wall, with said pipe being connected to a suction unit equipped with a system for regulating and monitoring the pressure that prevails in the chamber.

The process that was just described meets the requirements of quality and effectiveness desired by the producers of doped silicon wafers. In particular, this technology is compatible with a number of pieces of equipment used to date. It ensures an excellent uniformity of treatment over the entire surface of the same wafer, on each wafer of the same batch (lot of wafers charged on the support), as well as from batch to batch. It also makes possible the treatment of wafers without size limitation, which constitutes a certain advantage, in particular for the photovoltaic applications.

This is why the application of the process as described above to the creation of P-type junctions on silicon slices with a surface area that ranges from 50 cm² to 700 cm² is also an object of this invention. Round or square, boron-doped silicon slices, whose surface area corresponds to that of the wafers with current conventional dimensions, are obtained.

The technology that is described here also offers the advantage of allowing the finer manufacturing of doped conductive plates that therefore consume less silicon. The application of the process described above is claimed for the production of boron-doped silicon slices, with a thickness of between 100 μm and 150 μm. The combination of a larger size and a smaller thickness of the boron-doped silicon plates makes the latter particularly suitable for their use in the field of the manufacturing of photovoltaic cells. It allows in particular the manufacturing of semi-conductive plates that consume less silicon, which is decisive in a context of irregular supplies of raw materials.

The inventive process actually finds its application for the production of type P junctions on lots of one hundred or several hundred silicon slice(s) placed on their support at an interval that is less than or equal to 5 mm. Actually, the performance levels achieved by this process are such that it becomes possible to treat a large number of wafers in a homogeneous manner and in a single cycle even if they are arranged with a small spacing between them. This represents an undisputable industrial asset.

This invention is finally applicable for any technical development in the field of the manufacturing of photovoltaic cells or any other, requiring a P boron doping, with a high productivity, and makes possible in particular the manufacturing of bifacial photovoltaic plates.

In addition, the process as described can advantageously be applied to the production of boron-doped silicon slices designed for the manufacturing of photovoltaic cells from metallurgical-grade silicon N.

Other advantages and characteristics of the invention will emerge from reading the description below of an embodiment given by way of nonlimiting example.

EXAMPLE 1

FIG. 1 exhibits a diagrammatic cutaway view of a furnace according to the invention for the treatment of silicon wafers.

The furnace according to FIG. 1 is equipped with an airtight chamber 3 combined with heating means 9, into which the silicon wafers 1, placed on the support 2 and having to undergo the treatment, are introduced. The chamber 3, of cylindrical shape, is hermetically sealed at its ends by the stationary terminal wall 4 and by the door 13 that is protected by an opaque quartz thermal plug 14 with a diameter that is slightly less than that of the tube. The chamber comprises the treatment zone 5 and the free zone 6. The wafers 1 are arranged in the chamber 3 of the furnace in a manner that is transverse to the direction of flow of the gases.

The heating means 9, installed around the chamber 3, consist of 5 independent segments 9a-9e, making possible the creation of a suitable and controllable longitudinal thermal profile. The segment 9e of the heating device is perpendicular to the free zone 6.

The furnace comprises the three pipes 10, 11, 12 for introduction of gases into the chamber 3 and the gaseous effluent extraction pipe 15, which is connected to the suction unit 16, this suction unit being located at a distance from the furnace in a moderate zone. The suction unit 16 comprises a flowback suction pump, advantageously of the membrane type, produced, at least for its elements in contact with the gases, from a material that can withstand corrosion, for example based on a perfluorinated polymer such as polytetrafluoroethylene (PTFE) or perfluoroalkoxy (PFA), better known under the generic trade name of TEFLON. The suction unit 16 also comprises elements for monitoring and regulating the partial vacuum in the chamber of the furnace.

The pipes 10, 11, 12 for introducing gases into the chamber go through the end wall 4 on each side and empty into the free zone 6. The gas extraction pipe 15 also passes through the terminal wall 4, but it originates at the opposite end of the chamber. The first pipe 11 introduces hydrogen in the vicinity of the wall 4, and the second pipe 10 introduces the mixture $N_2$—$BCl_3$ also in the vicinity of the wall 4 for preventing the expected cracking of the $H_2$, $N_2$—$BCl_3$ mixture. The pipe 12 introduces oxygen into the chamber 3. This pipe empties into the chamber 3 at the treatment zone 5, close to the location occupied by the support 2 of the wafers 1.

EXAMPLE 2

This example describes a cycle for treatment of a lot of silicon wafers by a particular embodiment of the boron doping process according to the invention.

The treatment is done in a furnace as described in the preceding example. The support 2 is charged with 400 silicon wafers with a 150 mm diameter and is placed in the treatment zone 5 of the chamber 3. The door 13 is hermetically sealed, and the heating device 9 makes it possible to reach a regulated temperature of 960° C. for the treatment zone 5 and 880° C. in the free zone 6. At the end of several minutes, the reactive gases are allowed into the chamber for a stabilization of pressure and flow. The pressure is set at 30 kPa.

The carrier gas is nitrogen; the boron precursor is gaseous boron trichloride $BCl_3$.

The reactive gases are oxygen and hydrogen. The injection takes 15 minutes, with a total flow rate on the order of 5 liters of gas per minute in the following proportions:

$BCl_3$: 1 vol/minute,
$O_2$: 4 vol/minute,
$N_2$ and $H_2$: volumetric addition.

The active gas $BCl_3$ is initially mixed with nitrogen in strict proportions due to the use of a mass-flow monitoring device. The pressure of this mixture is adjusted and controlled to approximately one atmosphere. A valve that is installed between this device and the pipes for introducing gases ensures the pressure drop that is necessary for obtaining the desired pressure in the chamber of the reactor. In the same way, the composition and the flow rates and pressures of hydrogen and oxygen are strictly adjusted and controlled. At the end of this stage, a layer of boron oxide $B_2O_3$ is deposited on the surface of the slices.

The diffusion phase is then conducted for 30 minutes in the following manner: the temperature is kept at 960° C., and the pressure is brought to 250 mbar for a better heat exchange ensuring a uniformity of temperatures and therefore a uniformity of the diffusion. The flow rate of nitrogen and oxygen is kept at the same level as in the preceding stage.

At the end of the complete treatment cycle, the wafers are tested for different properties. The measurements carried out with the ellipsometer indicate that the glass formed on the surface of the wafers contains boron atoms over a thickness of 1,300 Angstroms. The refraction index is 1.475+/−0.025. The measurements of uniformity are carried out at nine points of three wafers per lot. A uniformity level of less than 5%, both from point to point on a plate and from plate to plate on a lot, and from lot to lot, is obtained.

It is therefore noted that the results of boron doping of silicon achieved under the conditions defined above in accordance with this invention are excellent, especially as the treated wafers are large, and 400 wafers have been doped in a single charging.

The invention claimed is:

1. A process for boron doping of silicon wafers placed on a support in a chamber of a furnace of which one end comprises a wall into which reactive gases and a carrier gas carrying a boron precursor in gaseous form are introduced, comprising the steps of:
a) injecting separately the reactive gases and boron trichloride $BCl_3$ that is diluted in the carrier gas into the chamber, and reacting said gases at a pressure of between 1 kPa and 30 kPa, and at a temperature of between 800° C. and 1100° C., for forming a boron oxide glass layer; and
b) carrying out diffusion of boron in silicon under an $N_2+O_2$ atmosphere at a pressure of between 1 kPa and 30 kPa.

2. The process according to claim 1, wherein in step b), the pressure in the chamber is between 15 kPa and 30 kPa.

3. The process according to claim 1, wherein during steps a) and b), the temperature in the zone of the chamber in the vicinity of the wafers, said treatment zone, is between 900° C. and 1000° C.

4. The process according to claim 1 wherein in step a), the boron trichloride is provided in the chamber at a rate of 20 $cm^3$/minute to 100 $cm^3$/minute.

5. The process according to claim 1, wherein the boron trichloride is diluted in the carrier gas to a concentration of between 3% and 95% by volume.

6. The process according to claim 1, wherein the total gaseous flow rate in the chamber is less than 5 liters per minute.

7. The process according to claim 1, wherein the reactive gases and the gas carrying boron trichloride are introduced into a free zone that is located in the section of the chamber between said end wall and the treatment zone that accommodates the wafers, where the gases are mixed before wetting said wafers, with said free zone occupying 10% to 20% of the total volume of the chamber.

8. The process according to claim 7, wherein during step a), the temperature in the free zone of the chamber is 5% to 15% less than the temperature of the treatment zone.

9. The process according to claim 1, wherein the gases that react with the precursor are oxygen and hydrogen, and the carrier gas is nitrogen or argon, with each of said gases being introduced into the chamber by a separate pipe.

10. The process according to claim 9, wherein hydrogen and the gas carrying boron trichloride are introduced into the chamber in the vicinity of the wall, and the oxygen is introduced into the free zone in the vicinity of the treatment zone.

11. The process according to claim 1, wherein in step a), the gases are introduced into the chamber in the following volumetric proportions:
Carrier gas+precursor of boron: 55% to 80%,
Hydrogen: 0.5% to 15%,
Oxygen: 15% to 30%.

12. The process according to claim 1, wherein before step a), operating parameters of the reactive gases and the carrier gas comprising flow rates, pressure, fluxes, and temperatures are stabilized for several tens of seconds.

13. The process according to claim 1, wherein the process creates P-type junctions on silicon slices with a surface area that ranges from 50 $cm^2$ to 700 $cm^2$.

14. The process according to claim 1, wherein the process produces boron-doped silicon slices, with a thickness of between 100 μm and 150 μm.

15. The process according to claim 1, wherein the process creates P-type junctions on lots of one hundred or several hundred silicon slices placed on their support at an interval of less than or equal to 5 mm.

16. The process according to claim 1, wherein the process produces boron-doped silicon slices designed for the manufacturing of photovoltaic cells from metallurgical-grade silicon.

* * * * *

UNITED STATES PATENT AND TRADEMARK OFFICE
CERTIFICATE OF CORRECTION

PATENT NO.       : 8,691,677 B2
APPLICATION NO.  : 13/262993
DATED            : April 8, 2014
INVENTOR(S)      : Yvon Pellegrin Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 87 days.

Signed and Sealed this

Twenty-ninth Day of September, 2015

Michelle K. Lee
*Director of the United States Patent and Trademark Office*